US009041122B2

(12) United States Patent
Yoo et al.

(10) Patent No.: US 9,041,122 B2
(45) Date of Patent: May 26, 2015

(54) SEMICONDUCTOR DEVICES HAVING METAL SILICIDE LAYERS AND METHODS OF MANUFACTURING SUCH SEMICONDUCTOR DEVICES

(71) Applicant: Samsung Electronics Co., Ltd., Suwon-si (KR)

(72) Inventors: Won-seok Yoo, Hwaseong-si (KR); Young-seok Kim, Seoul (KR); Han-jin Lim, Seoul (KR); Jeon-Il Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/267,008

(22) Filed: May 1, 2014

(65) Prior Publication Data

US 2015/0061136 A1  Mar. 5, 2015

(30) Foreign Application Priority Data

Aug. 27, 2013  (KR) .......................... 10-2013-012014

(51) Int. Cl.
H01L 29/417 (2006.01)
H01L 29/45 (2006.01)
H01L 21/764 (2006.01)
H01L 23/522 (2006.01)
H01L 21/768 (2006.01)
H01L 23/528 (2006.01)

(52) U.S. Cl.
CPC ...... *H01L 23/5225* (2013.01); *H01L 21/76879* (2013.01); *H01L 21/76892* (2013.01); *H01L 21/76849* (2013.01); *H01L 21/7682* (2013.01); *H01L 21/76834* (2013.01); *H01L 23/528* (2013.01); *H01L 23/5226* (2013.01)

(58) Field of Classification Search
None
See application file for complete search history.

(56) References Cited

U.S. PATENT DOCUMENTS

| 6,472,266 | B1 | 10/2002 | Yu et al. | |
|---|---|---|---|---|
| 7,998,870 | B2* | 8/2011 | Nam ............................. | 438/700 |
| 2002/0168830 | A1* | 11/2002 | DeBoer et al. ................ | 438/396 |
| 2004/0173912 | A1* | 9/2004 | Rhodes ......................... | 257/774 |
| 2007/0085207 | A1* | 4/2007 | Lee et al. ...................... | 257/739 |
| 2007/0096202 | A1 | 5/2007 | Kang et al. | |
| 2009/0085083 | A1* | 4/2009 | Shin ............................. | 257/297 |
| 2012/0280300 | A1 | 11/2012 | Kim et al. | |
| 2013/0043523 | A1 | 2/2013 | Ohno et al. | |
| 2013/0049098 | A1 | 2/2013 | Izumi et al. | |
| 2013/0267088 | A1* | 10/2013 | Baek et al. ................... | 438/637 |
| 2014/0077333 | A1* | 3/2014 | Son .............................. | 257/522 |
| 2014/0175659 | A1* | 6/2014 | Lee et al. ...................... | 257/773 |
| 2014/0179102 | A1* | 6/2014 | Joung et al. .................. | 438/666 |
| 2014/0306351 | A1* | 10/2014 | Kim ............................. | 257/774 |

FOREIGN PATENT DOCUMENTS

KR  1020120030173 A  3/2012

* cited by examiner

*Primary Examiner* — Joseph Schoenholtz
(74) *Attorney, Agent, or Firm* — Myers Bigel Sibley & Sajovec, P.A.

(57) ABSTRACT

Provided are a semiconductor device and a method of manufacturing the semiconductor device. In order to improve reliability by solving a problem of conductivity that may occur when an air spacer structure that may reduce a capacitor coupling phenomenon between a plurality of conductive lines is formed, there are provided a semiconductor device including: a substrate having an active region; a contact plug connected to the active region; a landing pad spacer formed to contact a top surface of the contact plug; a contact conductive layer formed to contact the top surface of the contact plug and formed in a space defined by the landing pad spacer; a metal silicide layer formed on the contact conductive layer; and a landing pad connected to the contact conductive layer in a state in which the metal silicide layer is disposed between the landing pad and the contact conductive layer, and a method of manufacturing the semiconductor device.

18 Claims, 12 Drawing Sheets

A-A'

SEMICONDUCTOR DEVICES HAVING METAL SILICIDE LAYERS AND METHODS OF MANUFACTURING SUCH SEMICONDUCTOR DEVICES

CROSS-REFERENCE TO RELATED APPLICATION

This application claims priority under 35 U.S.C. §119 from Korean Patent Application No. 10-2013-0102014, filed on Aug. 27, 2013 in the Korean Intellectual Property Office, the disclosure of which is incorporated herein in its entirety by reference.

BACKGROUND

As semiconductor devices become more highly integrated, the widths of the conductive lines in the devices and of the spaces formed between the conductive lines are being decreased. This decreased spacing may result in increased capacitive coupling between adjacent conductive lines. An air spacer may be used as an insulating spacer in order to reduce this capacitive coupling phenomenon.

SUMMARY

The inventive concept provides a semiconductor device having contact structures that may exhibit improved reliability and reduced capacitive coupling between adjacent conductive line structures while also providing a high integration density, as well as methods of manufacturing such semiconductor devices.

According to an aspect of the inventive concept, there is provided a semiconductor device including: a substrate having an active region; a contact plug that is electrically connected to the active region; a landing pad spacer that contacts a top surface of the contact plug; a contact conductive layer that contacts the top surface of the contact plug and that is formed in a space defined by the landing pad spacer; a metal silicide layer on the contact conductive layer; and a landing pad on the metal silicide layer opposite the contact conductive layer.

The contact plug may be disposed between a first conductive line structure and a second conductive line structure, and may have a first width in a first direction that is perpendicular to the first and second conductive line structures and parallel to a major surface of the substrate, while the contact conductive layer may have a second width that is smaller than the first width in the first direction, The contact plug and the contact conductive layer may be formed of the same material.

The semiconductor device may further include: a first conductive line and a second conductive line that is spaced apart from the first conductive line; a first insulating capping line on the first conductive line and a second insulating capping line on the second conductive line; a first insulating spacer structure that covers a first sidewall of the first conductive line; and a second insulating spacer structure that covers a first sidewall of the second conductive line, wherein the contact plug is formed within a contact hole formed in a space between the first and second insulating spacer structures.

The first insulating spacer structure may comprise an internal insulating spacer that covers sidewalls of the first conductive line, an external insulating spacer that defines a first side of the contact hole, and an air spacer between the external insulating spacer and the internal insulating spacer.

The semiconductor device may further include landing pad insulating patterns that contacts a portion of a top surface of the first insulating spacer structure and a portion of a top surface of the landing pad spacer, wherein the landing pad contacts the landing pad insulating pattern and vertically overlaps the first conductive line.

The semiconductor device may further include a conductive barrier layer that is disposed between an upper part of the first conductive line, the first insulating spacer structure, and the landing pad.

According to another aspect of the inventive concept, there is provided a method of manufacturing a semiconductor device, the method including: forming a contact hole in an active region of a substrate; forming a contact plug in the contact hole; forming a landing pad spacer to contact a top surface of the contact plug; forming a contact conductive layer on the top surface of the contact plug; and forming a metal silicide layer on the top surface of the contact conductive layer.

In some embodiments, the contact conductive layer may be formed by depositing polysilicon on the contact plug; and removing a portion of the deposited polysilicon. In other embodiments, the contact conductive layer may be formed by growing the contact conductive layer from the top surface of the contact plug using a selective epitaxial growth process.

Before the forming of the contact hole, the method may further include: forming a plurality of conductive line structures including an insulating layer, a conductive line and an insulating capping line on a substrate; forming insulating spacer structures on sidewalls of the conductive line structure; and forming the contact hole in a space defined between adjacent insulating spacer structures.

A first of the insulating spacer structures may be formed by: forming an internal insulating layer that covers a sidewall of a first of the conductive line structures; forming a sacrificial insulating layer that covers a sidewall of the internal insulating layer; and forming an external insulating layer that covers a top surface of the first of conductive line structure and a sidewall of the sacrificial insulating layer, and after the forming of the metal silicide layer, the method may further include forming an air spacer by selectively removing the sacrificial insulating layer.

The method may further include forming a landing pad on the metal silicide layer.

The forming of the landing pad may include: forming a conductive material layer that covers the metal silicide layer within the contact hole; and forming the landing pad that extends from an inside of the contact hole to an outside of the contact hole by etching a portion of the conductive material layer.

Before the forming of the conductive material layer, the method may further include forming a conductive barrier layer on the metal silicide layer.

Pursuant to further embodiments of the present invention, semiconductor devices are provided that include: a first conductive line structure on a first active region; a second conductive line structure on a second active region, the second conductive line structure extending parallel to the first conductive line structure and spaced apart from the first conductive line structure; a first insulating spacer structure on a sidewall of the first conductive line structure, the first insulating spacer structure including a first air spacer; a second insulating spacer structure on a sidewall of the second conductive line structure, the second insulating spacer structure including a second air spacer; a contact plug between the first and second insulating spacer structures; a first landing pad spacer on a top surface of the contact plug and on an upper portion of a sidewall of the first insulating spacer structure; a second landing pad spacer on a top surface of the contact plug and on an upper portion of a sidewall of the second insulating spacer structure; and a metal silicide layer between the first and second landing pad spacers; and a contact conductive layer between the contact plug and the metal silicide layer, wherein a width of the contact plug exceeds a width of the contact conductive layer.

The semiconductor may also include a landing pad insulating pattern on the first insulating spacer structure, the landing pad insulating pattern defining a top of the first air spacer.

The second insulating spacer structure may include an internal insulating layer, an external insulating layer and the second air spacer, and the external insulating layer defines a top surface of the second air spacer.

The semiconductor device may further include a landing pad that is on the metal silicide layer and between the first and second landing pad spacers.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1:
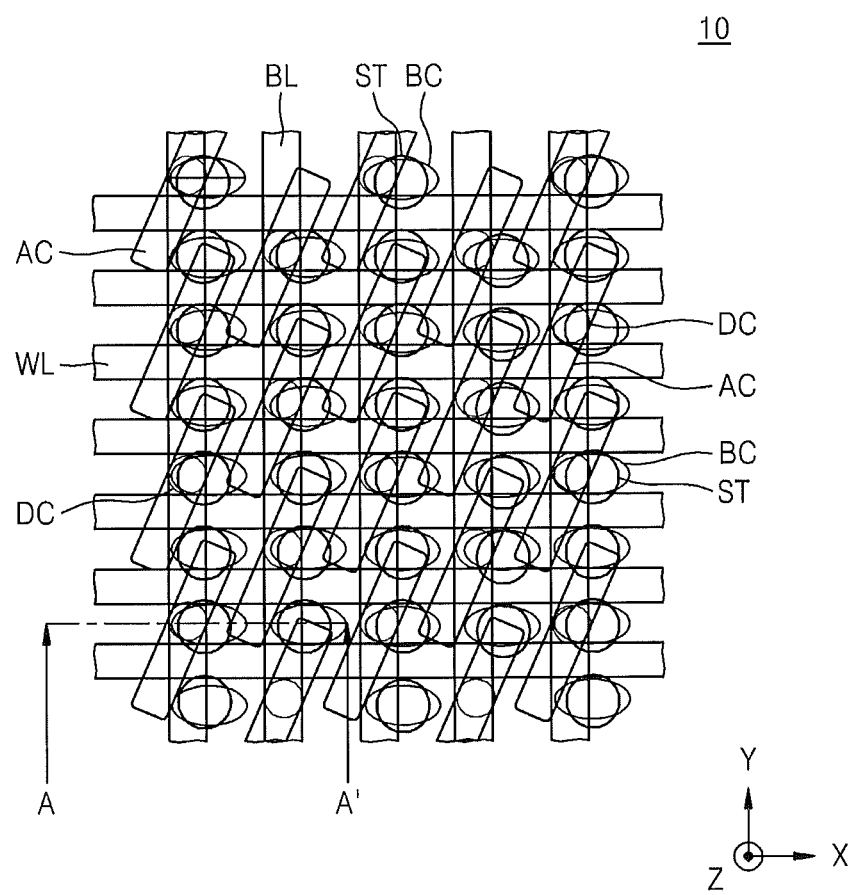
FIG. 1 is a schematic plan layout of a cell array region of a semiconductor device according to an example embodiment of the inventive concept.

Example embodiments of the present invention will now be described more fully with reference to the accompanying drawings. The present invention may, however, be embodied in many different forms and should not be construed as being limited to the example embodiments set forth herein; rather, these embodiments are provided so that this disclosure will be thorough and complete, and will fully convey the concept of the invention to those skilled in the art. In the drawings, like reference numerals refer to like elements, and redundant descriptions thereof will be omitted.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiment.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When an embodiment can be implemented in a different manner, a particular process order may be performed differently from the order described herein. For example, two process steps that are described herein as being consecutively performed may be substantially simultaneously performed or may be performed in an opposite order to the described order.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

As used herein, the term "and/or" includes any and all combinations of one or more of the associated listed items.

FIG. 1 is a schematic plan view of a cell array region of a semiconductor device 10 according to an example embodiment of the inventive concept. The layout illustrated in FIG. 1 may, for example, be applied to a memory cell having a unit cell size of $6F^2$ in a semiconductor memory device, where F represents a minimum lithographic feature size.

Referring to FIG. 1, the semiconductor device 10 includes a plurality of active regions AC. A plurality of wordlines WL cross the plurality of active regions AC and extend along a first direction (an X-direction in FIG. 1) so as to be parallel to each other. The wordlines WL may be disposed at regular intervals.

A plurality of bitlines BL are disposed on the plurality of wordlines WL and extend along a second direction (a Y-direction in FIG. 1) that is perpendicular to the X-direction. The bitlines BL may also be parallel to each other, and may cross over the word lines WL. The bitlines BL may be connected to the active regions AC through a plurality of direct contacts DC.

In some embodiment, the bitlines BL may be disposed in parallel to each other with a pitch of 3F. In some embodiment, the wordlines WL may be disposed in parallel to each other with a pitch of 2F.

A plurality of buried contacts BC may also be provided. Each buried contact BC may comprise a contact structure that extends from a region between two adjacent bitlines BL to an upper part of one of the two adjacent bitlines BL. In some embodiments, the buried contacts BC may be arranged in lines along the first direction and in lines along the second direction to form a grid pattern. In some embodiments, the buried contacts BC may be arranged along the second direction at regular intervals.

Figure 2:
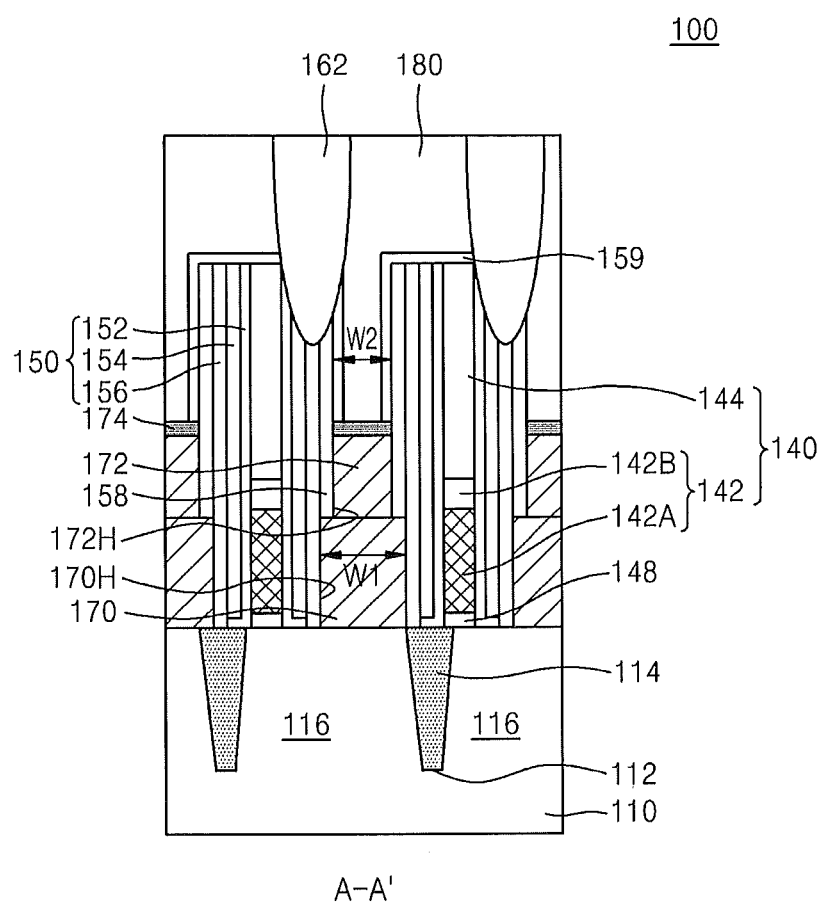
FIG. 2 is a cross-sectional view of a portion of the semiconductor device illustrated in FIG. 1.

FIG. 2 is a cross-sectional view of a main part of a semiconductor device 100 according to an example embodiment of the inventive concept. A cell array region of the semiconductor device 100 may have the layout illustrated in FIG. 1. FIG. 2 is a cross-sectional view corresponding to a cross-section taken along a line A-A' of FIG. 1.

Referring to FIG. 2, the semiconductor device 100 includes a substrate 110 having active regions 116 that are defined by an isolation layer 114.

The substrate 110 may include silicon (Si) and may comprise, for example, monocrystalline silicon, polycrystalline silicon or amorphous silicon. In some embodiments, the substrate 110 may include additional or other semiconductor materials, such as, for example, germanium (Ge), silicon germanium (SiGe), silicon carbide (SiC), gallium arsenide (GaAs), indium arsenide (InAs) or indium phosphide (InP). In some embodiments, the substrate 110 may include conductive regions. These conductive regions may comprise, for example, wells doped with an impurity or structures doped with an impurity.

A plurality of conductive lines 142 are provided on the substrate 110. An insulating pattern 148 may be disposed between each conductive line 142 and the substrate 110 so that each conductive line 142 is spaced apart from the substrate 110. The conductive lines 142 may extend on the substrate 110 along one direction (the y-direction in FIG. 1) so as to be parallel to each other. In some embodiments of the inventive concept, the conductive lines 142 may be formed as a double layer of first conductive lines 142A and second conductive lines 142B. In other embodiments, the conductive lines 142 may have a structure of one layer or a structure of at least three layers.

In some embodiments, the conductive lines 142 may constitute bitlines BL. In such embodiments, the conductive lines 142 correspond to the bitlines BL illustrated in FIG. 1.

An insulating capping line 144 is formed on each of the plurality of conductive lines 142. Each conductive line 142 and its corresponding insulating capping line 144 together constitute a conductive line structure 140.

Both sidewalls of each conductive line structures 140 may be covered with an insulating spacer structure 150. The insulating spacer structure 150 may include an internal insulating spacer 152, an external insulating spacer 156, and an air spacer 154. The air spacer 154 may be located between the internal insulating spacer 152 and the external insulating spacer 156.

Landing pad insulating patterns 162 are formed to contact a top surface of an upper part of at least some of the insulating spacer structures 150. The air spacer 154 of the insulating spacer structures 150 may be formed so that an upper part of the air spacer 154 may be closed by the corresponding landing pad insulating pattern 162. Side surfaces of the insulating spacer structures 150 may be covered by landing pad spacers 158. Conductive barrier layers 159 cover top surfaces and side surfaces of the landing pad spacers 158.

A plurality of first contact holes 170H are provided. Each first contact hole 170H may expose a respective, active region 116 in the substrate 110. The first contact holes 170H are defined at least in part by the insulating spacer structures 150 that cover the sidewalls of each of two adjacent conductive line structures 140. The first contact holes 170H may have a first width W1 in a direction (i.e., the x-direction in FIG. 1) that is perpendicular to a thickness direction of the substrate (i.e., the z-direction in FIG. 1) and that is also perpendicular to the direction in which the conductive line structures 140 extend (i.e., the y-direction in FIG. 1).

A plurality of contact plugs 170 are formed between the plurality of conductive line structures 140. The contact plugs 170 may be connected to the substrate 110 and may fill the respective first contact holes 170H. Each contact plug 170 may be connected to a respective active region 116 of the substrate 110 and may extend in a direction (the z-direction of FIG. 1) that is perpendicular to the bottom surface of the substrate 110.

Each landing pad spacer 158 may contact a portion of a top surface of one of the contact plugs 170 and may cover a sidewall of the insulating spacer structure 150. The landing pad spacers 158 define second contact holes 172H which are located above the respective contact plugs 170. The second contact holes 172H may have a second width W2 in the x-direction of FIG. 1 that is smaller than the first width W1.

A plurality of contact conductive layers 172 may fill portions of the respective second contact holes 172H. Each contact conductive layer 172 may directly contact a top surface of a corresponding one of the contact plugs 170. In some embodiments of the inventive concept, the contact conductive layers 172 may be formed of the same material as the contact plugs 170. However, the material used to form the contact conductive layers 172 is not limited to the same material as that of each contact plug 170.

A landing pad 180 may be formed on each contact conductive layer 172. The landing pad 180 may fill a space between downwardly extending portions of the conductive barrier layers 159, and may also be disposed on the conductive line structures 140. The landing pads 180 may also contact the landing pad insulating patterns 162 and may each have an island shape.

Metal silicide layers 174 may be formed between each contact conductive layer 172 and its corresponding landing pad 180. Each metal silicide layer 174 may fill a lower portion of one of the second contact holes 172H, and may directly contact the contact conductive layer 172. The metal silicide layers 174 may be formed of for example, at least one material selected from the group consisting of cobalt silicide ($CoSi_x$), nickel silicide ($NiSi_x$), and manganese silicide ($MnSi_x$). In one embodiment of the inventive concept, the metal silicide layer 174 may be formed of cobalt silicide ($CoSi_x$).

The contact plugs 170, the contact conductive layers 172 and the metal silicide layers 174 may electrically connect each active region 116 of the substrate 110 to a respective one of the landing pads 180. Each landing pad 180 contacts the conductive barrier layer 159 and the landing pad insulating patterns 162, and vertically overlaps a respective one of the conductive line structures 140. Each landing pad 180 electrically connected to a respective one of the contact plugs 170 via a respective one of the contact conductive layers 172. Each contact conductive layer 172 fills a portion of the second contact hole 172H that is between the landing pad spacers 158 and between a pair of conductive line spacers 140. The metal silicide layers 174 are disposed between the contact conductive layers 172 and the landing pads 180.

As will be described in more detail below, pursuant to embodiments of the present invention, an air spacer 154 may be formed without forming a metal silicide layer 174 directly on the contact plugs 170. For example, a contact conductive layer 172 may be formed on the respective contact plugs 170 and the metal silicide layers 174 may be formed on the contact conductive layers 172 so that the metal silicide layers 174 are spaced apart from the respective contact plugs 170 by a predetermined gap. A portion of the insulating spacer structure 150 may be selectively removed during the device fabrication process. However, an etching material that is used in the selective etching of the insulation spacer structures 150 may not contact the metal silicide layers 174. Thus, melting of the metal silicide layers 174 can be reduced or prevented so that the reliability of the contact structures can be improved.

FIGS. 3 through 14 are cross-sectional views illustrating a method of manufacturing a semiconductor device according to example embodiments of the inventive concept.

A cell array region of a semiconductor device illustrated in FIGS. 3 through 14 may have the layout illustrated in FIG. 1. FIGS. 3 through 14 are cross-sectional views taken along the line A-A' of FIG. 1. Reference numerals of FIGS. 3 through 14 that are the same as those of FIG. 2 represent like elements, and detailed descriptions thereof will be omitted.

Figure 3:
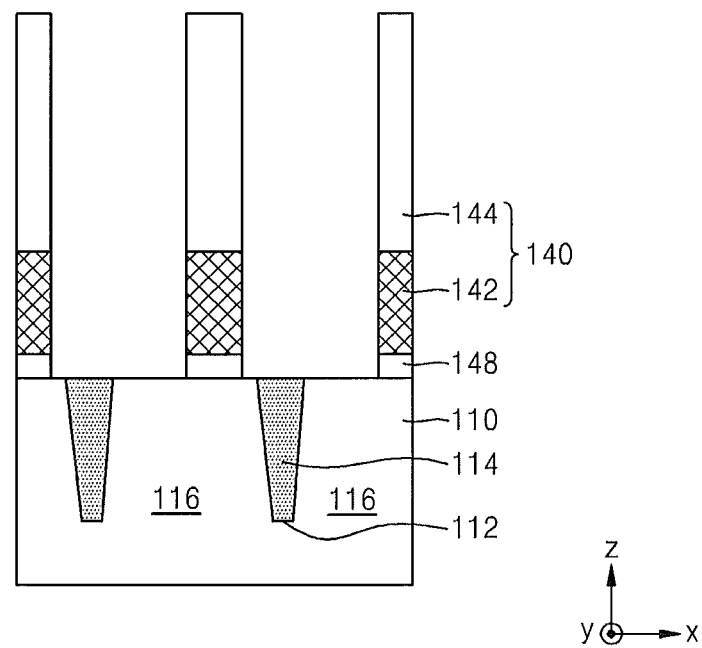
FIGS. 3 through 14 are cross-sectional views illustrating a method of manufacturing a semiconductor device according to embodiments of the inventive concept.

Referring to FIG. 3, an isolation trench 112 is formed in the substrate 110, and an isolation layer 114 is formed within the isolation trench 112. A plurality of active regions 116 are defined by the isolation layer 114 in the substrate 110. Each active region 116 may have a shape of a comparatively long island having a short axis and a long axis, like the active region AC illustrated in FIG. 1.

The isolation layer 114 may include a single layer formed of one type of insulating layer or a multiple layers formed of a combination of at least three types of insulating layers. The isolation layer 114 may be formed of silicon oxide, silicon nitride, or one material selected from a combination thereof.

An insulating pattern 148 is formed on the substrate 110. A plurality of conductive line structures 140 are formed on the insulating pattern 148. The conductive line structures 140 extend in parallel to each other. The conductive line structures 140 includes a plurality of conductive lines 142 and a plurality of insulating capping lines 144 that cover top surfaces of the plurality of conductive lines 142. In some embodiments, the conductive lines 142 may include at least one material selected from the group consisting of polysilicon, a semiconductor metal doped with an impurity, a conductive metal nitride, and metal silicide. In some embodiments, the plurality of conductive lines 142 may be formed as a multiple layer structure in which a metal silicide layer, a metal barrier layer and an electrode layer formed of a metal or a metal nitride are sequentially stacked. For example, the plurality of conductive lines 142 may have a stacked structure in which doped polysilicon, titanium nitride (TiN) and tungsten (W) are sequentially stacked.

In some embodiments, the insulating capping lines 144 are formed of silicon nitride. A thickness of each insulating capping line 144 may exceed the thickness of each conductive line 142.

In some embodiments, in order to form the conductive line structures 140, a conductive layer is formed on the substrate 110 and then an insulating layer is formed on the conductive layer. A thickness of the insulating layer may exceed a thickness of the conductive layer. The insulating layer is then patterned to form the insulating capping lines 144. Thereafter, the conductive layer may be patterned using the insulating capping lines 144 as an etching mask to form the conductive lines 142. The insulating pattern 148 may be formed prior to deposition of the conductive layer and the insulating layer used to form the conductive lines 142 and the insulating capping pattern 144, respectively, or may instead be formed by depositing a second insulating layer on the substrate 110 before the conductive layer is deposited and then etching this second insulating layer using the capping insulating pattern 144 as an etching mask to form the insulating pattern 148.

Figure 4:
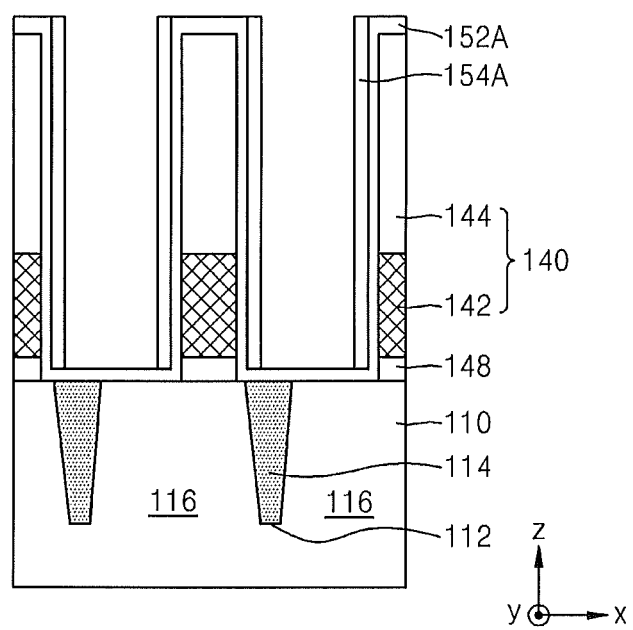

Referring to FIG. 4, a top surface and both side surfaces of each of the conductive line structures 140 are covered with an insulating material, thereby forming an insulating layer 152A. The insulating layer 152A is used to form an internal insulating spacer, as will be described in more detail below. After the insulating layer 152A has been formed, a sacrificial insulating layer 154A that is used to form an air spacer is formed that covers the exposed sidewalls of the insulating layer 152A.

The insulating layer 152A and the sacrificial insulating layer 154A may be formed of at least one material selected from the group consisting of a silicon oxide, a silicon nitride, and a combination thereof. In some embodiments of the inventive concept, the insulating layer 152A may be formed as a silicon nitride (SiN) layer, and the sacrificial insulating layer 154A may be formed of a silicon oxide ($SiO_2$) layer. The insulating layer 152A may be formed using one process selected from the group consisting of a chemical vapor deposition (CVD) process, a physical vapor deposition (PVD) process and an atomic layer deposition (ALD) process. The sacrificial insulating layer 154A may be formed on the insulating layer 152A using one process selected from the group consisting of CVD, PVD and ALD. After the above-described deposition processes, the sacrificial insulating layer 154A is selectively etched to form the air spacer 154. When the sacrificial insulating layer 154A is formed as a silicon oxide ($SiO_2$) layer, the etchant may be a material that selectively etches silicon oxide. Due to the selective removal process, only a portion of the sacrificial insulating layer 154A that is formed to contact side surfaces of the insulating layer 152A remains, and the portions of the sacrificial insulating layer 154A that are formed on the insulating layer 152A parallel to a direction of a main surface of the substrate 110 are removed. The sacrificial insulating layer 154A is selectively etched so that the insulating layer 152A formed on the top surface of the insulating capping line 144 and the top surface of the substrate 110 may be exposed.

Figure 5:
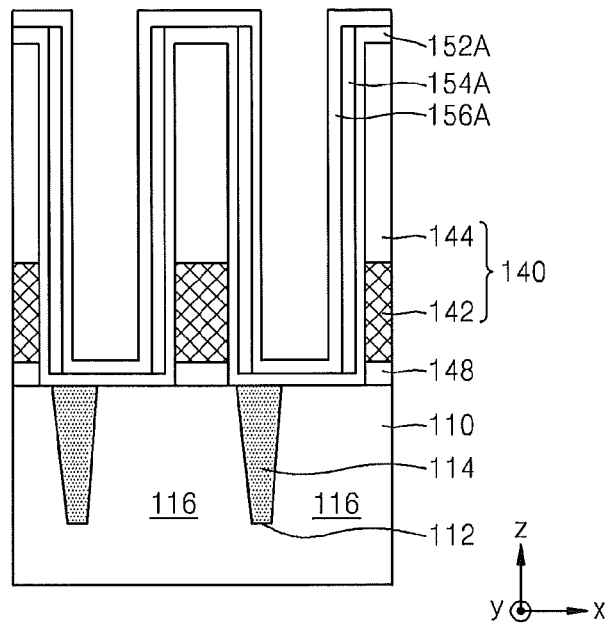

Referring to FIG. 5, an insulating layer 156A that is used to form the external insulating spacer is formed to cover side surfaces of the sacrificial insulating layer 154A and the exposed surfaces of the insulating layer 152A. The insulating layer 156A may be formed of at least one material selected from the group consisting of silicon oxide, silicon nitride, and a combination thereof. In some embodiments of the present invention, the insulating layer 156A may be formed of silicon nitride (SiN). The insulating layer 156A may be formed using one process selected from the group consisting of CVD, PVD and ALD.

Figure 6:
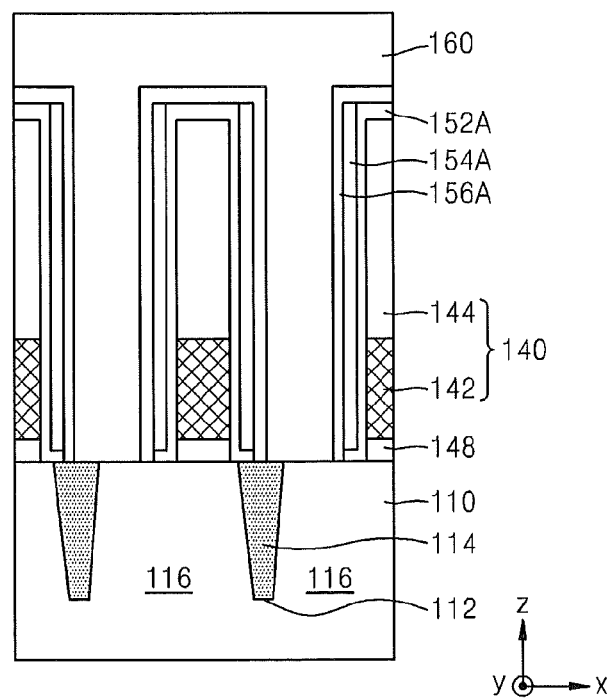

Referring to FIG. 6, a blocking layer 160 is formed on the insulating layer 156A. The blocking layer 160 may be formed in the space defined by the sidewalls of the insulating layer 156A (i.e., in the open area between adjacent pairs of conductive line structures 140). The blocking layer 160 may reduce or prevent the insulating layer 156A from being etched in an etching process that is subsequently performed during the formation of the contact plugs 170. The blocking layer 160 may serve as an etch stop layer.

In some embodiments of the inventive concept, the blocking layer 160 may be formed using one process selected from the group consisting of a CVD process, a plasma enhanced chemical vapor deposition (PECVD) process, a high density plasma chemical vapor deposition (HDCVD) process and an ALD process. The blocking layer 160 may be formed of a silicon oxide, such as, for example, at least one selected from the group consisting of BPSG, PSG, USG, SOG, FOX, TEOS, PE-TEOS and TOSZ. In some embodiments of the inventive concept, the blocking layer 160 may be formed of Tonen Silazene (TOSZ).

Figure 7:
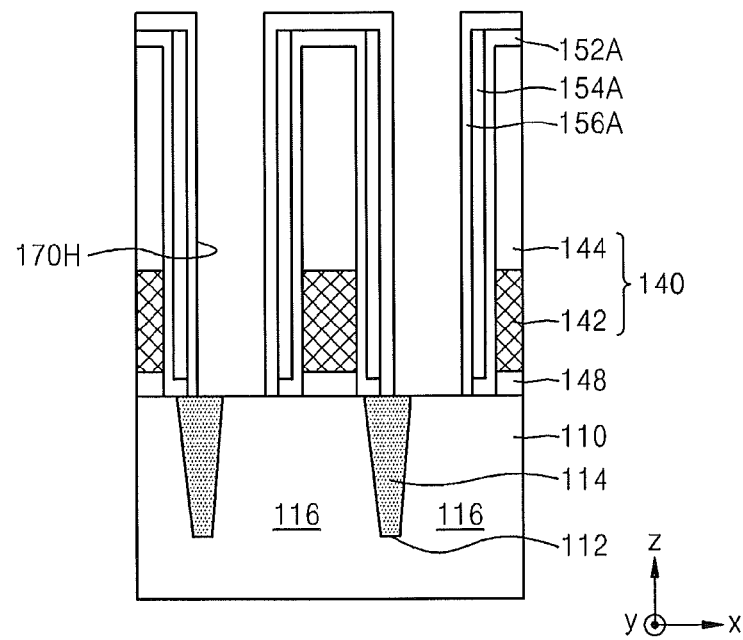

Referring to FIG. 7, a plurality of first contact holes 170H are formed through the blocking layer 160 to expose the active regions 116 in the substrate 110. The first contact holes 170H may be formed in a space defined between adjacent insulating layers 156A, as shown in FIG. 7. The first contact holes 170H may be formed by selectively removing portions of the blocking layer 160. The first contact holes 170H may be formed by etching the blocking layer 160 using an etch back process using an etching mask.

Figure 8:
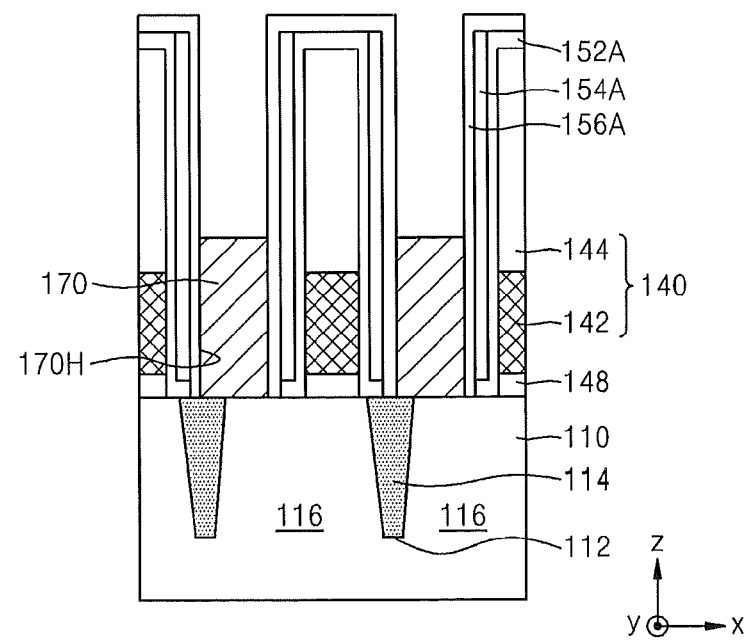

Referring to FIG. 8, in the cell array region, a conductive layer is formed that fills at least a bottom portion of the first contact holes 170H. The conductive layer may be formed using one method selected from the group consisting of CVD, PVD and silicon epitaxial growth. In some embodiments of the inventive concept, the conductive layer may comprise doped polysilicon. The conductive layer may directly contact the active regions 116 in the substrate 110.

After the conductive layer has been formed, a portion of the conductive layer is selectively removed to form the contact plugs 170. In some embodiments of the inventive concept, since the conductive layer may be formed of polysilicon, and the conductive layer may be selectively removed using a dry etching method using a silane gas or an etch back process so that a step height of the conductive layer may be reduced. Since upper parts of the conductive line structures 140 are covered by the insulating layer 156A, the conductive line structures 140 may not be affected by the selective removal process, and the height of the conductive line structures 140 may be maintained.

Figure 9:
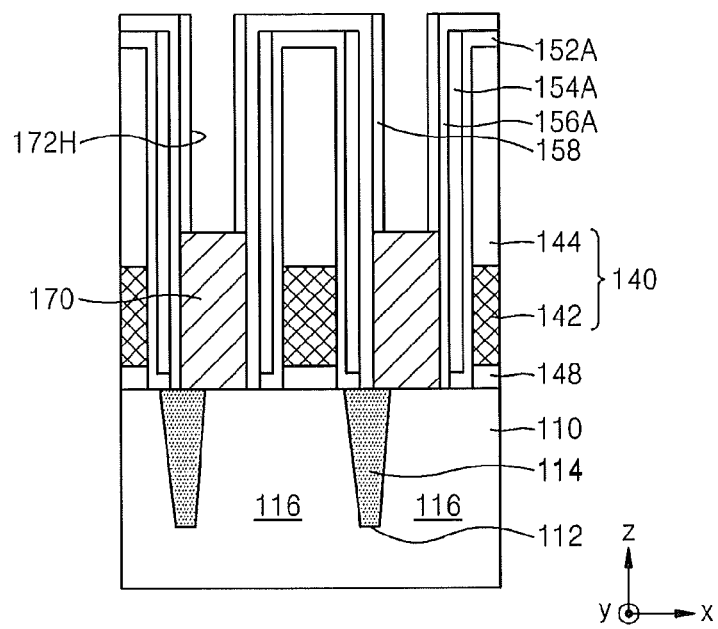

Referring to FIG. 9, landing pad spacers 158 are formed. The landing pad spacers 158 may each contact a portion of the top surface of a contact plug 170 and may cover one of the insulating layers 156A.

The landing pad spacers 158 may be formed by forming an insulating layer to cover the top surface of the contact plugs 170 and the top surfaces and side surfaces of the insulating layers 156A. The insulating layer 156A may be formed of at least one selected from the group consisting of a silicon oxide, a silicon nitride, and a combination thereof. In some embodiments of the inventive concept, the insulating layer that is used to form the landing pad spacers 158 may be formed of a silicon nitride, and may be formed using one process selected from the group consisting of CVD, PVD and ALD.

The insulating layer that is formed on the contact plugs 170 and insulating layers 156A may then be selectively removed using an etching process to form the landing pad spacers 158. As shown in FIG. 9, as a result of the selective etching the landing pad spacers 158 are formed on side surfaces of the insulating layer 156A.

Adjacent landing pad spacers 158 define second contact holes 172H above the contact plugs 170 between adjacent pairs of conductive line structures 140.

Figure 10:
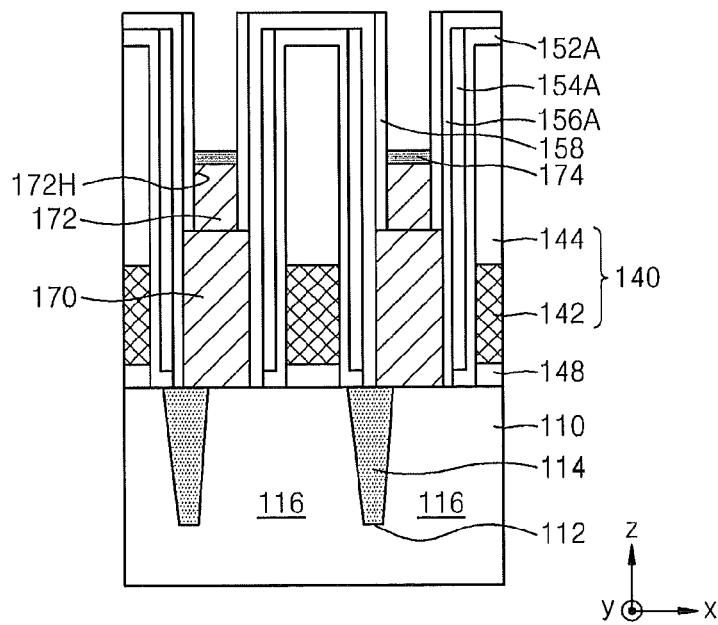

Referring to FIG. 10, contact conductive layers 172 are formed that fill portions of the respective second contact holes 172H. The contact conductive layers 172 may directly contact the top surfaces of the respective contact plugs 170.

Each contact conductive layer 172 may physically and electrically contact a respective one of the contact plugs 170. The contact conductive layers 172 may be formed of the same material as the contact plugs 170. In some embodiments of the inventive concept, the contact conductive layers 172 may be formed of polysilicon.

The contact conductive layers 172 may be formed using an etch back process that selectivity removes portions of a deposited polysilicon layer or via a selective silicon epitaxial growth process. In some embodiments of the inventive concept, since both the contact plug 170 and the contact conductive layer 172 may be formed of polysilicon, the contact conductive layer 172 may be formed using the above-described selective silicon epitaxial growth process.

Metal silicide layers 174 may be formed on an exposed top surfaces of the contact conductive layer 172. The metal silicide layers 174 may be formed of at least one silicide layer selected from the group consisting of cobalt silicide ($CoSi_x$), nickel silicide ($NiSi_x$) and manganese silicide ($MnSi_x$). In some embodiments of the inventive concept, the metal silicide layers 174 may comprise cobalt silicide ($CoSi_x$). However, according to the inventive concept, the metal silicide layer 174 is not limited thereto and may comprise any appropriate metal silicide.

In some embodiments of the inventive concept, the following processes may be performed so as to form the metal silicide layers 174. First, a metal layer is deposited on the exposed top surface of each of the contact conductive layers 172. This metal layer is then silicidated by performing a first rapid thermal processing (RTP) process. The first RTP process may be performed at a temperature of about 450 to 550° C. Next, any remaining metal of the metal layer that did not react with silicon atoms may be removed. Then, a second RTP process is performed at a higher temperature than a temperature of the first RTP process, for example, at a temperature of about 800 to 950° C., to form the metal silicide layers 174. Subsequently, any remaining metal that did not react with the silicon atoms may be removed. In some embodiments, the metal layer may comprise a cobalt (Co) metal layer so that the metal silicide layers 174 may comprise cobalt silicide layers.

Figure 11:
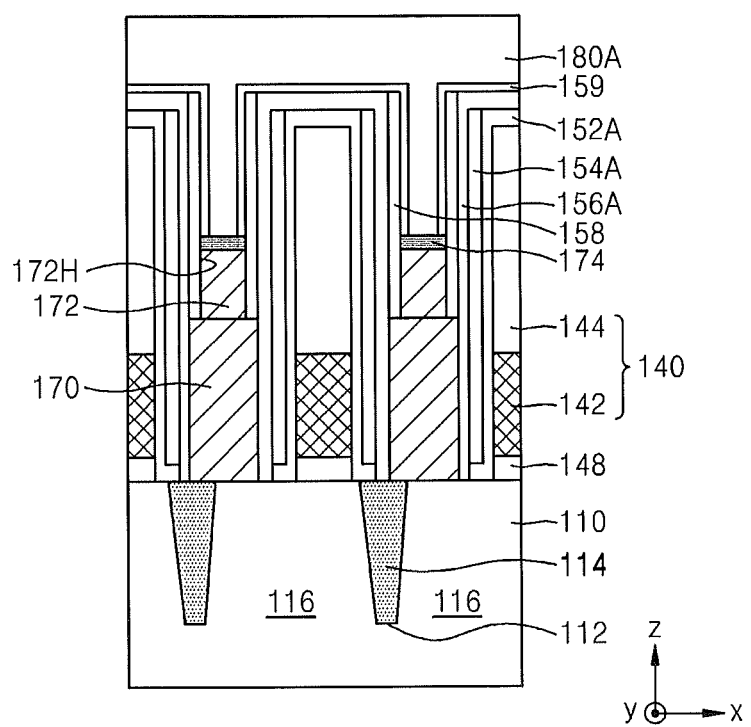

Referring to FIG. 11, conductive barrier layers 159 are formed that covers the exposed surface of the insulating layers 156A, the exposed surfaces of the contact conductive layers 172 and the exposed inner surfaces of the landing pad spacers 158. A material layer 180A that is used to form the landing pad may then be formed on the conductive barrier layers 159.

The conductive barrier layers 159 may be formed of a material selected from the group consisting of titanium (Ti), titanium nitride (TiN) and a stacked structure thereof.

The material layer 180A that is used to form the landing pads 180 may be formed by depositing at least one material selected from the group consisting of a metal material including tungsten (W) and a conductive material including doped polysilicon. In some embodiments of the inventive concept, the material layer 180A may be formed of tungsten (W). The material layer 180A is connected to the contact conductive layers 172 and the contact plugs 170 via the conductive barrier layers 159.

Figure 12:
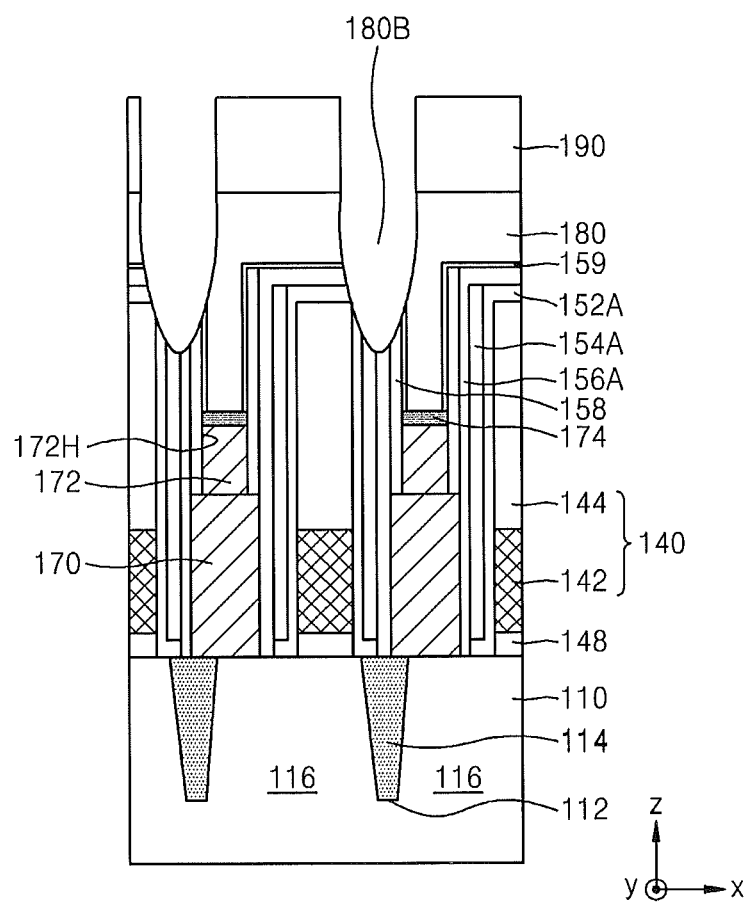

Referring to FIG. 12, upper portions of the insulating capping lines 144, the insulating layers 152A, the sacrificial insulating layers 154A, the insulating layers 156A, the landing pad spacers 158 and the conductive barrier layers 159 are removed using an etching mask 190 to form recesses 180B in the cell array region.

The etching mask 190 may have a plurality of island-shaped mask patterns. When the cell array region is etched using the etching mask 190, a step height of the recess 180B is reduced in the cell array region, and a plurality of island-shaped landing pads 180 may remain from the material layer 180A. Each landing pad 180 may fill a space above a respective one of the contact conductive layers 172, and may also vertically overlap a respective one of the conductive line structures 140.

Owing to the above-described etching processes, a portion of top surfaces of the insulating layers 152A, the sacrificial insulating layers 154A and the insulating layers 156A are exposed by the recesses 180B. Additionally, a portion of the top surfaces of the conductive barrier layer 159 is removed.

Figure 13:
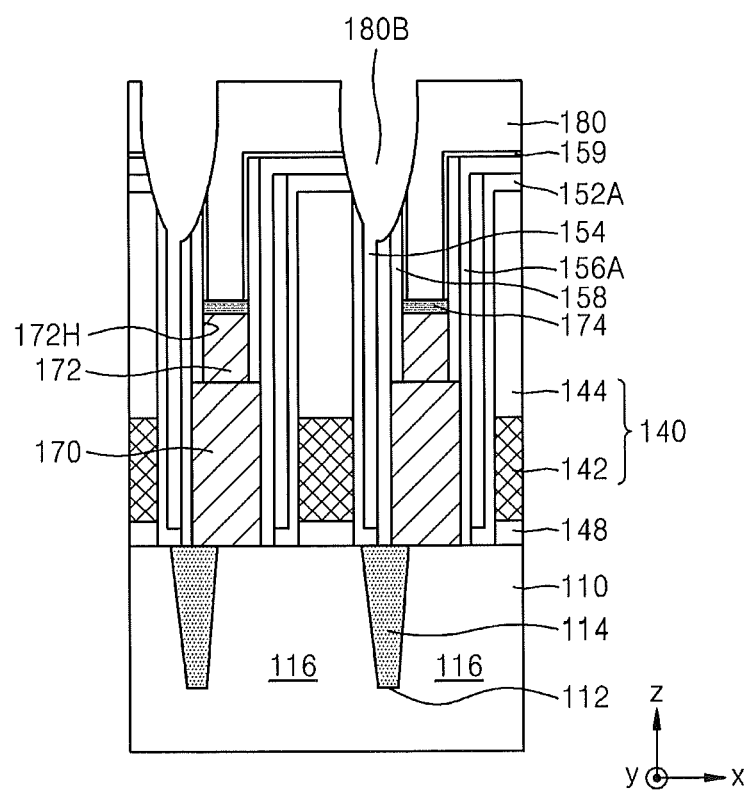

Referring to FIG. 13, an etching material is deposited in the recesses 180B that selectively etches the sacrificial insulating layer (see 154A of FIG. 12) so that air spacers 154 are formed. The etching mask 190 may then be removed. In other embodiments, the etching mask 190 may be removed first, and the sacrificial insulating layer 154A may be selectively removed later.

Since the recesses 180B exposes portions of the top surfaces of the sacrificial insulating layers 154A, air spacers 154 may be formed by selectively removing the sacrificial insulating layers 154A using, for example, a selective etching process. In some embodiments of the inventive concept, since the sacrificial insulating layers 154A may comprise silicon oxide layers, an etching process that selectively removes silicon oxide may be used. For example, the air spacers 154 may be formed by selectively removing only the sacrificial insulating layers 154A using a wet etching process using at least one washing solution selected from an LAL solution and an SC-1 solution.

Figure 14:
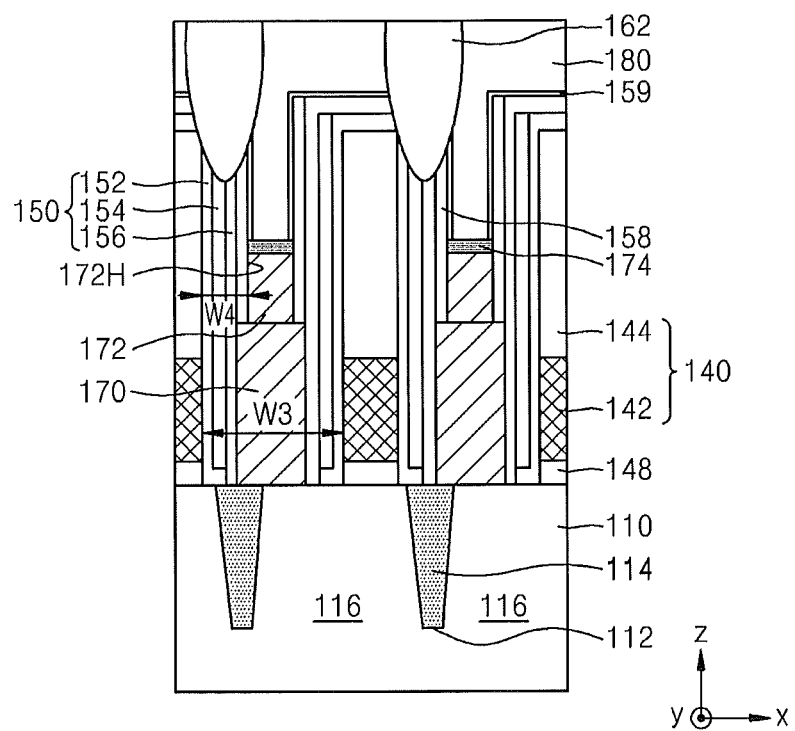

Referring to FIG. 14, landing pad insulating patterns 162 are formed that fill the recesses 180B, thereby completing formation of the insulating spacer structures 150 that include the air spacers 154.

The landing pad insulating patterns 162 may be formed by depositing an insulating material into the recesses 180B. The landing pad insulating patterns 162 may be formed of at least one material selected from the group consisting of a silicon oxide, a silicon nitride, and a combination thereof. In some embodiments of the inventive concept, the landing pad insulating patterns 162 may comprise silicon nitride that is deposited via a CVD process. The landing pad insulating patterns 162 may insulate the landing pads 180 from each other. That is, the landing pad insulating patterns 162 may prevent a bridge phenomena between two adjacent landing pads 180.

Via the above process, an internal insulating spacer 152 having an upper part covered by the conductive barrier layer 159 is formed from the insulating layer 152A, and the landing pad insulating patterns 162 are formed from an upper part of one side surface of the insulating layer 156A. An external insulating spacer 156 that is covered by the conductive barrier layer 159 is formed from an upper part of the other side surface of the insulating layer 156A. A height of an air spacer between the internal insulating spacer 152 and the external insulating spacer 156 is defined by the landing pad insulating patterns 162 so that the air spacer 154 is formed in a space defined by the landing pad insulating patterns 162, the internal insulating spacer 152 and the external insulating spacer 156.

The air spacers 154 may extend along a lengthwise direction of the conductive line structures 140. The air spacers 154 are formed between adjacent conductive lines 142, the contact plugs 170 and the contact conductive layers 172 within a limited space of a highly-downscaled, highly-integrated semiconductor device so that relative permitivity between the conductive lines 142, the contact plugs 170 and the contact conductive layers 172 decreases, and capacitance between adjacent conductive lines 142 or capacitance between the conductive lines 142, the contact plugs 170 and the contact conductive layers 172 may be reduced.

The internal insulating spacers 152, the external insulating spacers 156, and the air spacers 154 constitute insulating spacer structures 150. Although the insulating spacer structures 150 in the above-described embodiment comprise three-layer structures that each include the internal insulating spacer 152, the air spacer 154 and the external insulating spacer 156, it will be appreciated that in other embodiments the insulating spacer structure 150 may include the air spacer 154 and a different number of layers (e.g., a four layer structure).

In some embodiments, a melting phenomenon of the metal silicide layer 174 that may occur if an etching solution for forming the air spacers 154 permeates the recesses 180B may be reduced or prevented, which may provide semiconductor devices having increased reliability. When the sacrificial insulating layer 154A is removed via a wet etching process using a solution having an etching selectivity as described with reference to FIG. 13, the solution may permeate the metal silicide layers 174 by perforating the external insulating spacers 156, which may melt the metal silicide layers 174.

This melting phenomenon may occur because in the process that is used to form the first contact holes 170H (described with reference to FIG. 7), the process used to etch the blocking layers 160 may also etch a portion of the insulating layers 156A, and the process used to form the contact plugs 170 (described with reference to FIG. 8) may further etch a portion of the insulating layer 156A during the etch back of the conductive layer. As a result, the thickness of the insulating layers 156A may be reduced. If the thickness of the insulating layers 156A is reduced sufficiently the metal silicide layers 174 may be partially melted during the formation of the air spacers 154. If this occurs, the conductivity between the contact plugs 170 and the landing pads 180 may be reduced, which may adversely affect the performance of the semiconductor device.

One potential method of solving this problem would be to increase the thickness of the external insulating spacers 156. However, as integration density increases, the horizontal width W3 between adjacent conductive lines 142 may be about 30 nm, for example. When a thickness W4 of the sum of each external insulating spacer 156 and the landing pad spacer 158 formed on side surfaces of the pair of conductive line structures 140 is about 9 nm, for example, contact holes may not be formed. In the above-described case, a contact structure that may connect the active region 116 of the substrate 110 may not be obtained.

According to the inventive concept, contact conductive layers 172 that electrically connect to respective ones of the contact plugs 170 are formed in the second contact holes 172H that are defined by the landing pad spacer 158 so that a semiconductor device may be obtained that may have reduced susceptibility to melting of the metal silicide layers 174 yet does not require thicker external insulating spacers 156. That is, the metal silicide layers 174 are formed on top surfaces of the contact conductive layers 172 so that the external insulating spacers 156 and the landing pad spacers 158 may protect the metal silicide layers 154 from the wet etching solution that is used to form the air spacers 154, to reduce or prevent melting of the metal silicide layers 174.

Figure 15:
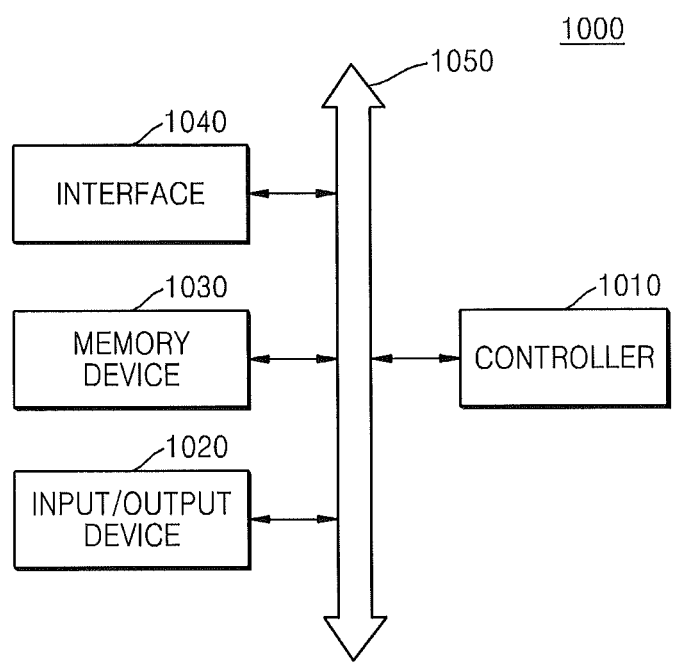
FIG. 15 is a block diagram of a system that includes a semiconductor device according to an example embodiment of the inventive concept.

FIG. 15 illustrates a system 1000 that includes a semiconductor device 100 according to an exemplary embodiment of the inventive concept.

The system 1000 includes a controller 1010, an input/output device 1020, a memory device 1030, and an interface 1040. The system 1000 may be a mobile system or a system to which information is transmitted or from which information is received. In some embodiments, the mobile system may be a personal digital assistant (PDA), a portable computer, a web tablet, a wireless phone, a mobile phone, a digital music player or a memory card. The controller 1010 is used to control an execution program in the system 1000 and may be a microprocessor, a digital signal processor, a microcontroller, or the like. The input/output device 1020 may be used to input data to or output data from the system 1000. The system 1000 may be connected to an external device such as, for example, a personal computer or a network using the input/output device 1020, and may exchange data with such an external device. The input/output device 1020 may be a keypad, a keyboard, or a display, for example.

The memory device 1030 may store codes and/or data for performing an operation of the controller 1010 or may store data processed by the controller 1010. The memory device 1030 includes a semiconductor device according to the inventive concept. For example, the memory device 1030 may include the semiconductor device 100 illustrated in FIG. 2.

The interface 1040 may be a data transmission path between the system 1000 and another external device. The controller 1010, the input/output device 1020, the memory device 1030, and the interface 1040 may communicate with each other via a bus 1050. The system 1000 may be used in a mobile phone, an MP3 player, a navigation device, a portable multimedia player (PMP), a solid state disk (SSD), or household appliances.

Figure 16:
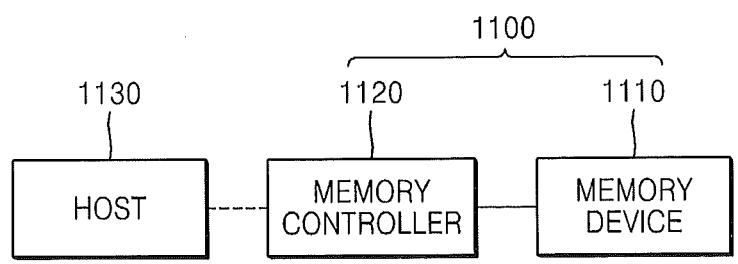
FIG. 16 is a block diagram of a memory card that includes a semiconductor device according to an example embodiment of the inventive concept.

FIG. 16 illustrates a memory card 1100 including the semiconductor device 100 according to an example embodiment of the inventive concept.

The memory card 1100 includes a memory device 1110 and a memory controller 1120.

The memory device 1110 may store data. In some embodiment, the memory device 1110 may have nonvolatile characteristics that stored data may be maintained even when a supply of power is cut off. The memory device 1110 may include the semiconductor device 100 illustrated in FIG. 2.

The memory controller 1120 may read data stored in the memory device 1110 in response to a read/write request of a host 1130 or may store data of the memory device 1110. The memory controller 1120 may include the semiconductor device 100 of FIG. 2.

While the inventive concept has been particularly shown and described with reference to example embodiments thereof, it will be understood that various changes in form and details may be made therein without departing from the spirit and scope of the following claims.

What is claimed is:

1. A semiconductor device comprising:
a substrate having an active region;
a contact plug electrically connected to the active region;
a landing pad spacer that contacts a top surface of the contact plug;
a contact conductive layer that contacts the top surface of the contact plug and that is formed in a space defined by the landing pad spacer;
a metal silicide layer on the contact conductive layer; and
a landing pad on the metal silicide layer opposite the contact conductive layer.

2. The semiconductor device of claim 1, wherein the contact plug is disposed between a first conductive line structure and a second conductive line structure,
wherein the contact plug has a first width in a first direction that is perpendicular to the first and second conductive line structures and parallel to a major surface of the substrate, and
wherein the contact conductive layer has a second width that is smaller than the first width in the first direction.

3. The semiconductor device of claim 1, wherein the contact plug and the contact conductive layer comprise a same material.

4. The semiconductor device of claim 1, further comprising:
a first conductive line and a second conductive line that is spaced apart from the first conductive line;
a first insulating capping line on the first conductive line and a second insulating capping line on the second conductive line;
a first insulating spacer structure on a first sidewall of the first conductive line; and
a second insulating spacer structure on a first sidewall of the second conductive line,
wherein the contact plug is within a contact hole formed in a space between the first and second insulating spacer structures.

5. The semiconductor device of claim 4, wherein the first insulating spacer structure comprises an internal insulating spacer on sidewalls of the first conductive line, an external insulating spacer that defines a first side of the contact hole, and an air spacer between the external insulating spacer and the internal insulating spacer.

6. The semiconductor device of claim 4, further comprising a landing pad insulating pattern that contacts a portion of a top surface of the first insulating spacer structure and a portion of a top surface of the landing pad spacer,
wherein the landing pad contacts the landing pad insulating pattern and vertically overlaps the first conductive line.

7. The semiconductor device of claim 6, further comprising a conductive barrier layer that is disposed between an upper part of the first conductive line, the first insulating spacer structure, and the landing pad.

8. A method of manufacturing a semiconductor device, the method comprising:
forming a contact hole to expose an active region of a substrate;
forming a contact plug in the contact hole;
forming a landing pad spacer to contact a top surface of the contact plug;
forming a contact conductive layer on the top surface of the contact plug in a space defined by the landing pad spacer;
forming a metal silicide layer on the top surface of the contact conductive layer; and
forming a landing pad on the metal silicide layer opposite the contact conductive layer.

9. The method of claim 8, wherein forming the contact conductive layer comprises:
depositing polysilicon on the contact plug; and
removing a portion of the deposited polysilicon.

10. The method of claim 8, wherein forming the contact conductive layer comprises growing the contact conductive layer from the top surface of the contact plug using a selective epitaxial growth process.

11. The method of claim 8, before the forming of the contact hole, further comprising:
forming a plurality of conductive line structures that each comprise an insulating layer, a conductive line and an insulating capping line on the substrate;
forming insulating spacer structures on sidewalls of the conductive line structures; and
forming the contact hole in a space defined between adjacent insulating spacer structures.

12. The method of claim 11, wherein forming a first of the insulating spacer structures comprises:
forming an internal insulating layer on a sidewall of a first of the conductive line structures;
forming a sacrificial insulating layer on a sidewall of the internal insulating layer; and
forming an external insulating layer on a top surface of the first of the conductive line structures and on a sidewall of the sacrificial insulating layer,
after the forming of the metal silicide layer, the method further comprising forming an air spacer by selectively removing the sacrificial insulating layer.

13. The method of claim 8, wherein forming the landing pad comprises:
forming a conductive material layer on the metal silicide layer within the contact hole; and
forming the landing pad that extends from an inside of the contact hole to an outside of the contact hole, by etching a portion of the conductive material layer.

14. The method of claim 13, before forming the conductive material layer, further comprising forming a conductive barrier layer on the metal silicide layer.

15. A semiconductor device, comprising:
a first conductive line structure on a first active region;
a second conductive line structure on a second active region, the second conductive line structure extending parallel to the first conductive line structure and spaced apart from the first conductive line structure;
a first insulating spacer structure on a sidewall of the first conductive line structure, the first insulating spacer structure including a first air spacer;
a second insulating spacer structure on a sidewall of the second conductive line structure, the second insulating spacer structure including a second air spacer;
a contact plug between the first and second insulating spacer structures;
a first landing pad spacer on a top surface of the contact plug and on an upper portion of a sidewall of the first insulating spacer structure;
a second landing pad spacer on a top surface of the contact plug and on an upper portion of a sidewall of the second insulating spacer structure;
a metal silicide layer between the first and second landing pad spacers; and
a contact conductive layer between the contact plug and the metal silicide layer, wherein a width of the contact plug exceeds a width of the contact conductive layer; and
a landing pad on the metal silicide layer opposite the contact conductive layer.

16. The semiconductor device of claim 15, further comprising a landing pad insulating pattern on the first insulating spacer structure, the landing pad insulating pattern defining a top of the first air spacer.

17. The semiconductor device of claim 16, wherein the second insulating spacer structure includes an internal insulating layer, an external insulating layer and the second air spacer, and wherein the external insulating layer defines a top surface of the second air spacer.

18. The semiconductor device of claim 16, wherein the landing pad is between the first and second landing pad spacers.

\* \* \* \* \*